United States Patent [19]
Arvidsson

[11] Patent Number: 5,267,479
[45] Date of Patent: Dec. 7, 1993

[54] FORCE ACTUATOR ARRANGEMENT

[75] Inventor: Thomas Arvidsson, Ljungby, Sweden

[73] Assignee: SAB Wabco AB, Sweden

[21] Appl. No.: 862,745

[22] PCT Filed: Dec. 17, 1990

[86] PCT No.: PCT/SE90/00846

§ 371 Date: Jul. 23, 1992

§ 102(e) Date: Jul. 23, 1992

[87] PCT Pub. No.: WO91/10083

PCT Pub. Date: Jul. 11, 1991

[30] Foreign Application Priority Data

Dec. 21, 1989 [SE] Sweden ................ 8904310

[51] Int. Cl.$^5$ ............................................ H02K 35/00
[52] U.S. Cl. ........................................ 74/126; 74/106;
74/585; 188/24.12; 310/92
[58] Field of Search ................. 74/126, 106, 520, 585;
188/24.12, 24.14, 24.18, 24.22, 158, 161;
310/92, 93, 26, 37

[56] References Cited

U.S. PATENT DOCUMENTS

| | | | |
|---|---|---|---|
| 2,539,913 | 1/1951 | Koepcke | 74/520 |
| 2,694,935 | 11/1954 | Roehri | 74/520 |
| 2,884,803 | 5/1959 | Willis | 74/520 X |
| 3,248,579 | 4/1966 | Plasko | 74/126 |
| 4,139,830 | 2/1979 | Streich et al. | 74/520 X |
| 4,766,357 | 8/1988 | Glomb, Jr. | 310/26 X |
| 4,802,660 | 2/1989 | Engdahl | 310/26 X |
| 4,959,567 | 9/1990 | Ealey et al. | 310/26 |
| 5,039,894 | 8/1991 | Teter et al. | 310/26 |

FOREIGN PATENT DOCUMENTS

| | | | |
|---|---|---|---|
| 396525 | 1/1974 | U.S.S.R. | 74/126 |
| 970017 | 10/1982 | U.S.S.R. | 74/126 |

Primary Examiner—Allan D. Herrmann
Assistant Examiner—William O. Trousdell
Attorney, Agent, or Firm—Laurence R. Brown

[57] ABSTRACT

A force actuator arrangement comprises a force generating member performing an oscillating movement, preferably a rod (7) of magnetostrictive material, force transmitting means-in a disc brake arrangement a caliper (4,5)-, and a device (8,9) for transforming the oscillating movement to a unidirectional application movement of the force transmitting means. The oscillation frequency of the force generating member is higher than the natural frequency of the force transmitting means for enabling the movement transforming device to transmit the movement only during each oscillation stroke in the application direction.

1 Claim, 3 Drawing Sheets

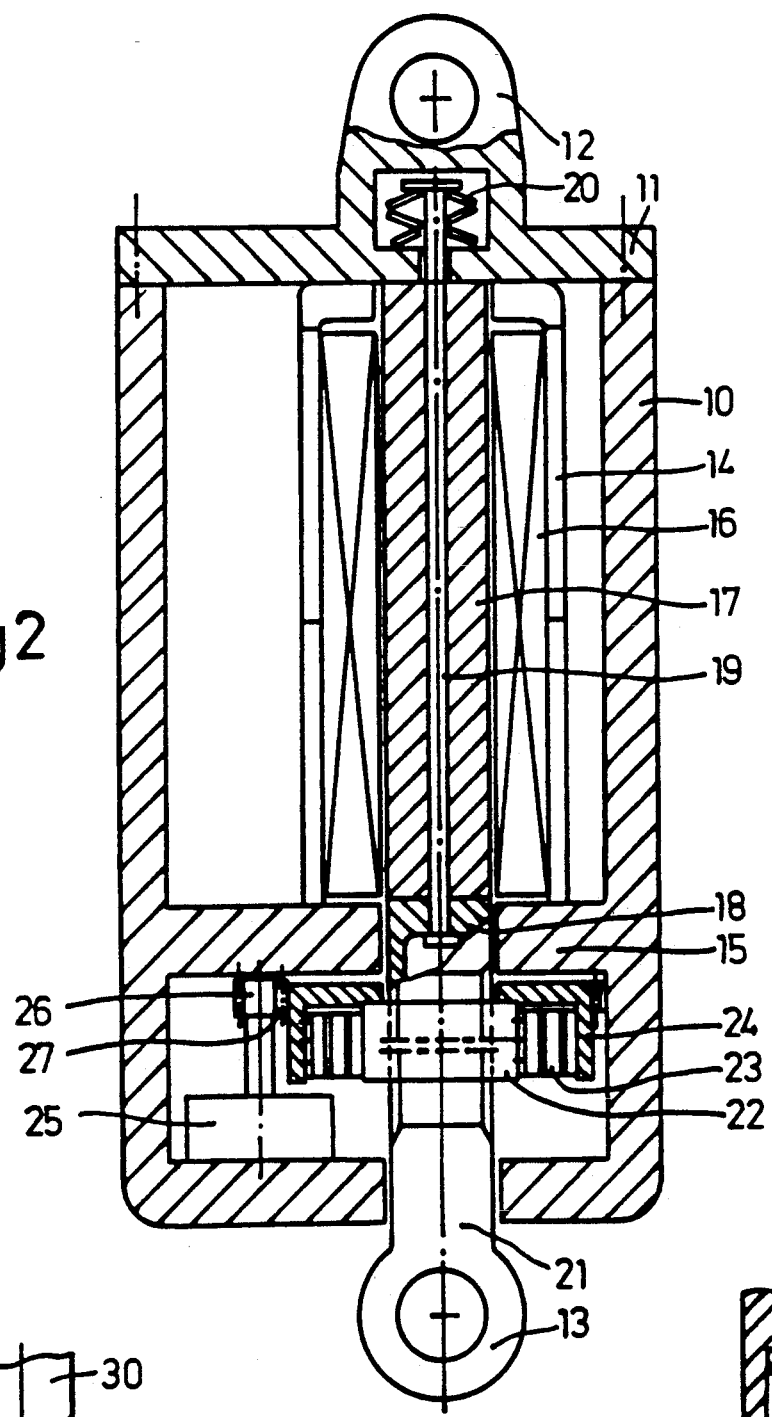
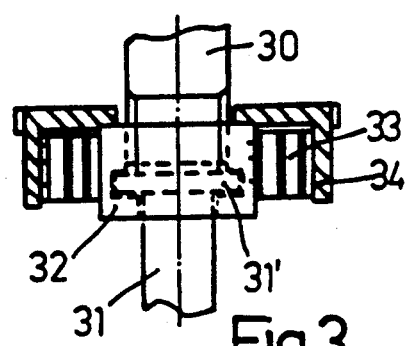
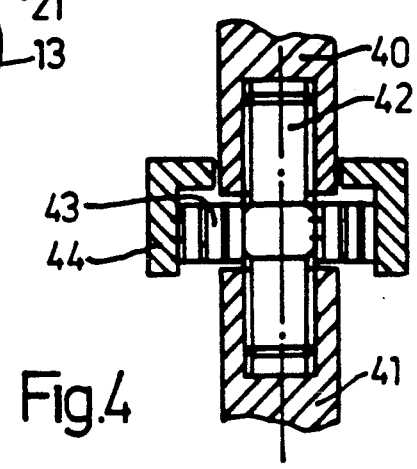

FORCE ACTUATOR ARRANGEMENT

TECHNICAL FIELD

This invention relates to a force actuator arrangement comprising a force generating member performing a reciprocating axial movement, force transmitting means intended to apply a force by unidirectional movement in an application direction and a device for transforming the reciprocating movement to the unidirectional application movement

TECHNICAL BACKGROUND

In a number of different ways it is possible to accomplish a reciprocating movement or force, which it may be desirable to transform into a unidirectional movement or force. A relatively recently developed technique is to utilize materials having magnetostrictive properties. Magnetostriction means that a material changes its dimensions when exposed to a magnetic field.

Materials with such properties are typically alloys with rare earth metals, an alloy with terbium and iron being available under the name Terfenol. This material Terfenol has a very high magnetostriction, namely up to 0.2% at a magnetic field with a field strength of appr. 3000 oersted, and a very fast response.

Due to the magnetostriction a Terfenol rod exposed to a pulsating magnetic field and prestressed for accomplishing a return to original shape will have reciprocating length and accordingly exert an reciprocating force.

In order to utilize this reciprocating movement or force in a practical force actuator this movement has to be transformed—by a movement transforming device into a unidirectional movement of a push rod or the like in the actuator.

The Invention

In order to allow such a movement transforming device to perform its intended function to create a unidirectional movement from a reciprocating movement, the arrangement according to the invention is characterized in that the reciprocation frequency of the force generating member is higher than the natural frequency of the force transmitting means for enabling the movement transforming device to transmit the movement only during each reciprocating stroke in the application direction.

In this way the movement transforming device will disconnect the force transmitting means, which in a disc brake arrangement include the caliper, from the force generating member—a Terfenol rod—during each reciprocating stroke in the direction opposite the application direction, so that a step-wise application movement with extremely small steps is obtained. In a practical embodiment of a disc brake arrangement the Terfenol rod may have a reciprocating frequency of 1000 Hz, whereas the natural frequency of the disc brake caliper may be 130 Hz.

BRIEF DESCRIPTION OF THE DRAWINGS

The invention will be described in further detail below reference being made to the accompanying drawings, in which FIG. 2 is a side-view, mostly in of another embodiment of an actuator for an arrangement according to the invention, FIGS. 3 and 4 are side-views, partly in section, of two modified devices for use in an actuator according to FIG. 2.

DETAILED DESCRIPTION OF EMBODIMENTS

Figure 1:
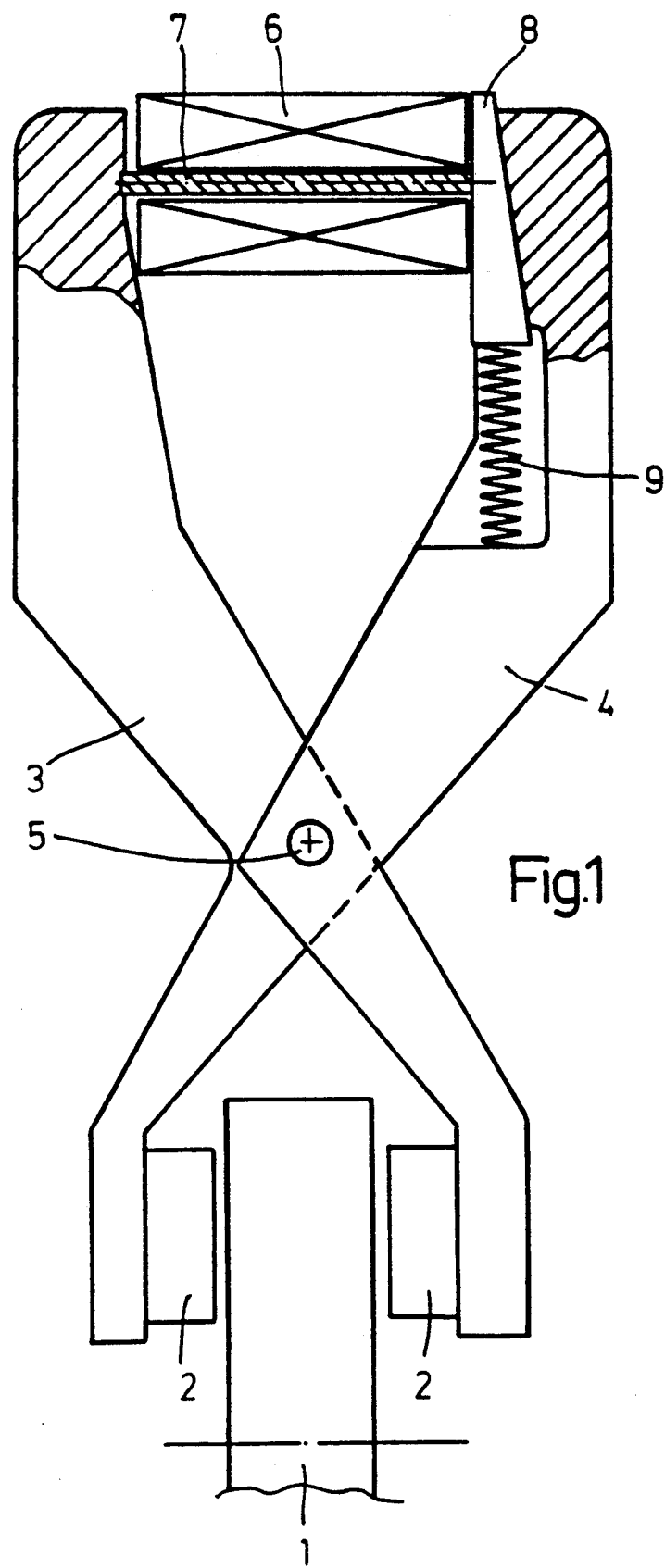
FIG. 1 shows a rather simple embodiment of a disc brake with an actuator according to the invention.

FIG. 1 shows a simple disc brake arrangement, which illustrates the invention.

The arrangement is intended to brake a rotating disc 1 by means of brake pads 2 arranged at the ends of two caliper levers 3 and 4 pivotally attached to each other at 5. The braking action is obtained by pushing the ends of the levers 3 and 4 opposite the pads 2 apart.

In the simple arrangement according to FIG. 1 this is accomplished by an electric coil 6 surrounding a rod 7 of the material called Terfenol, with the characteristics to prolong itself up to say 0.2% of its length when subjected to a certain magnetic field (from the coil 6). The rod 7 is connected to the lever 3 to the left in FIG. 1 and cooperates with the lever 4 to the right via a wedge 8. The wedge 8 is biased upwards by a compression spring 9 and cooperates with a wedge surface in the lever 4.

The coil 6 is electrically activated in a pulsating manner. The mass inertia of the levers 3 and 4 is considerably larger than that of the rod 7 and the self-locking mechanism constituted by the wedge 8 and spring 9. Each time the coil 6 is activated, the rod 7 is slightly extended with the result that the levers 3 and 4 are pressed apart. When on the other hand the rod 7 returns to its original length due to the deactivation of the coil 6, the wedge 8 will be free for a short while and will be pushed upwards in FIG. 1 by its spring 9. Depending on the frequency of the pulsating currency supplied to the coil 6 and the geometry of the arrangement, the brake pads 2 will be applied to the disc 1 with a certain force and speed.

For releasing the brake the coil may be again be activated by a pulsating current, but the wedge 8 will in this instance be pushed back (against the force of the compression spring 9) by for example a solenoid (not shown).

An actuator shown in FIG. 2 and intended for an arrangement according to the invention has a housing 10 with a lid 11 attached thereto. The lid 11 is provided with a fixed ear 12, whereas a movable ear 13 extends out of the housing 10 opposite the fixed ear 12. These ears are to be connected to a disc brake arrangement of the same general type as illustrated in FIG. 1.

A cylindrical permanent magnet 14 is arranged within the housing 10 supported by a partition-wall 15 therein, and a cylindrical coil 16 is provided within the permanent magnet. A rod 17 of Terfenol is arranged within the coil 16.

Coaxially in line with the rod 17 is a drive member in the form of a drive sleeve 18. A pull bar 19 provided with end flanges at both ends extends through holes in the drive sleeve 18, the rod 17 and the lid 11. A compression spring 20 (in the form of a number of belleville springs) is arranged between the lid 11 and the end flange of the bar 19 for the purpose of excerting a pull force in the bar 19 and accordingly providing a prestress in the Terfenol rod 17, which is essential for its intended function.

A movement transforming device for this actuator has the following design:

Coaxially in line with the drive sleeve 18 is a push rod 21, which extends out through the housing 10 and is ended by the ear 13. When the ear 13 is connected to a brake rigging (not shown), the push rod 21 is non-rotatable. The drive sleeve 18 and the push rod 21 are provided with external threads, that are oppositely directed and cooperate with corresponding internal threads in a connection member in the form of a connection ring 22. The respective threads are self-locking but have a pitch that is as great as possible in order to minimize the power required. The connection ring 22 should have a minimal mass inertia for making it easily movable.

The connection ring 22 is normally exposed to a torque (in the direction for pushing the sleeve 18 and rod 21 apart) by means of a clock spring or spiral spring 23. This spring 23 is at its inner end attached to the connection ring 22 and at its outer end to an outer ring 24. This outer ring 24 may be rotated in either direction by means of an electric motor 25 connected by a pinion 26 to a gear ring 27 at the outer periphery of the outer ring 24. The motor 25 has the primary purpose to keep the spring 23 tensioned at all times and the secondary purpose to rewind the connection ring 22 by rotation in the direction opposite to that for tensioning the spring. When not operating the electric motor 25 is locked.

The basis for the operation of the disclosed actuator is that the prestressed rod 17 of Terfenol is caused to reciprocate by means of a pulsating magnetic field. Further, there are self-locking means in the form of the connection ring 22 only requiring a small outer force for its operation. The reciprocation frequency for the rod 17 has to be greater than the natural frequency of the brake rigging to which the actuator is connected.

The following discussion is based on the assumptions that an actuator of this kind with a Terfenol rod 17 as the force-generating means has to have an application stroke of some 3-4 mm, an application time of 0.1 s and an application force of 10000N.

The specific property of the Terfenol material is that its length increases when exposed to a magnetic field; the property is called magnetostriction. The material chosen has a high magnetostriction, namely up to 0.2%, and a very fast response. The material has to be prestressed in order to return to its original dimension when not exposed to the magnetic field.

Calculations have shown that under the following conditions the desired results may be obtained:

A rod 17 with a length of 100 mm and a diameter of 20 mm is under a mechanical prestress of 3700N by the spring 20 This rod is caused to reciprocate at a frequency of 1000 Hz by being exposed to the combination of a constant magnetic field from the permanent magnet 14 of 130 kA/m and a pulsating magnetic field from the coil 16 of ±130 kA/m; the resulting positive magnetic field pulsates between zero and 260 kA/m.

For obtaining this magnetic field the coil 16 may have an inner diameter of 22 mm, an outer diameter of 40 mm and a length of 110 mm. The current may be 5 A and the voltage 625 V for obtaining the desired magnetic field with a climbing time of 0.25 ms and a power of 806 W.

Provided that the mass of the brake rigging levers is 15 kg, the force 10000N and the time for reaching this force 0.25 ms, the final speed will be 83 mm/s and the movement 0.007 mm.

It has been demonstrated that the Terfenol rod 17 reciprocates under the influence of the magnetic field and delivers the desired forces. This reciprocating movement of the drive sleeve 18 is to be transferred to a unidirectional application movement of the push rod 21 by means of the self-locking connection ring 22. The simple principle thereof is to be non-rotational during each small reciprocation movement in the application direction of the Terfenol rod 17 and to increase the distance between the drive sleeve 18 and the push rod 21 by small rotation during each small reciprocation movement in the retraction direction. This small rotation of the connection ring 22 is accomplished by the spring 23.

It is essential that the connection ring 22 has a very low mass inertia and a high thread pitch (in opposite directions). With an outer diameter of 30 mm and an inner diameter of 20 mm and a pitch of 7 mm/turn a torque of less than 4 Nm from the spring 23 is required.

As has already been described, the spring 23 is tensioned by the electric motor 25 or by similar means. The return stroke (by rotating the connection ring 22 in the opposite direction) can also be obtained by the electric motor 25. A more direct transmission of this rotational movement than by the spring 23 can be obtained by providing a one-way clutch between the connection ring 22 and the outer ring 24.

Two modified versions of the movement transforming device are shown in FIGS. 3 and 4.

In the FIG. 3 modification there is a drive member or sleeve 30, a push rod 31, a connection ring 32, a clock or spiral spring 33 and an outer ring 34. The reciprocating drive sleeve 30 is in similar thread engagement with the connection ring 32 as in the FIG. 2 version, whereas the connection ring is freely rotatable in relation to, but axially connected to the push rod 31, which for this purpose is provided with a head 31' engaging a corresponding recess in the connection ring 32.

In the FIG. 4 modification the drive member 40 and the push rod 41 are provided with internal threads for self-locking cooperation with external threads of a connection member in the form of a connection rod 42. A clock or spiral spring 43 joins this rod 42 with an outer ring 44.

Figure 5:
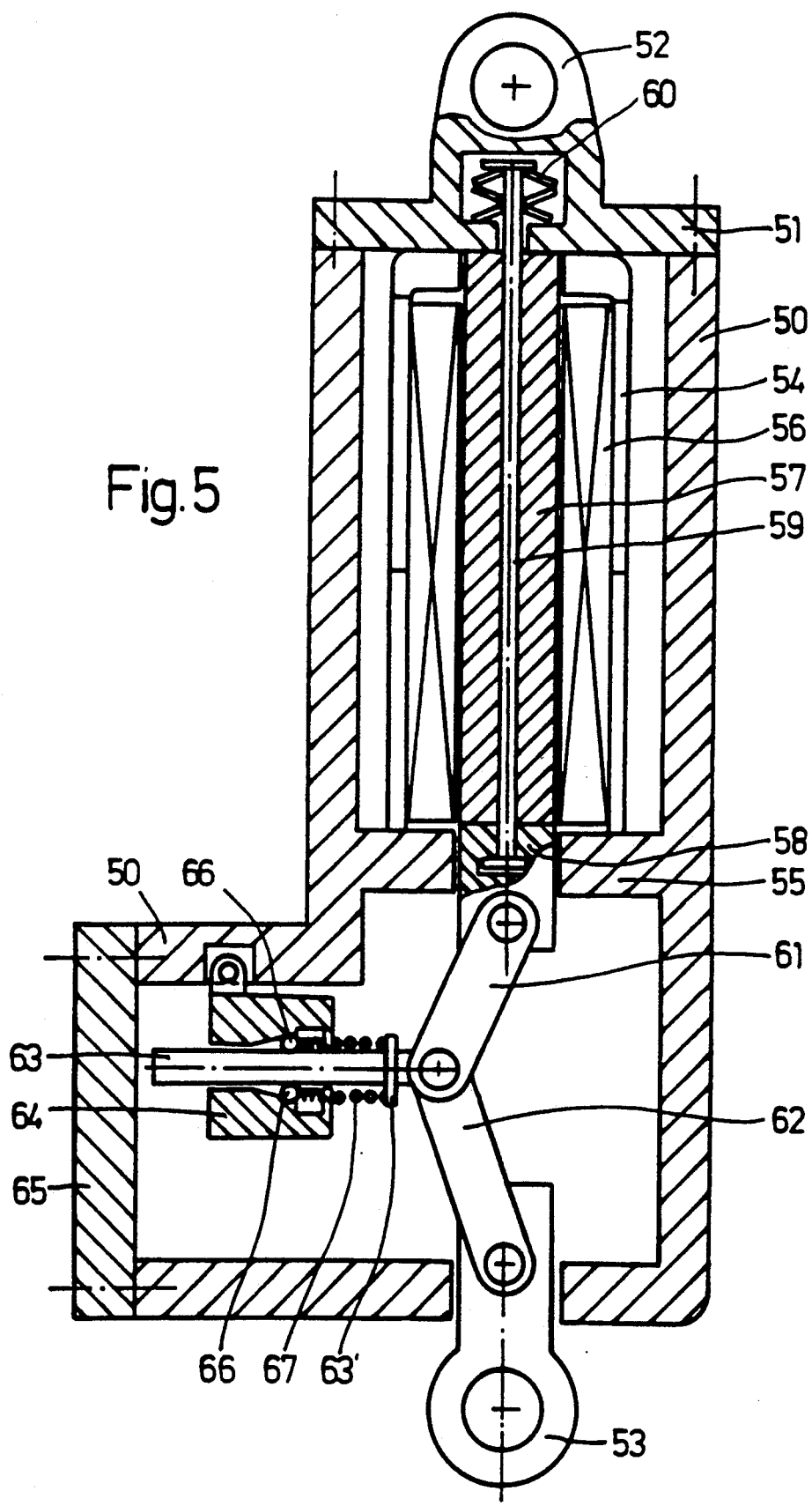
FIG. 5 is a side-view, mostly in section, of still another embodiment of an actuator for an arrangement according to the invention.

FIG. 5 shows a slightly different actuator, which in the same way as the actuator according to FIG. 2 is intended for a disc brake arrangement of the same general type as shown in FIG. 1. However, the actuator may equally well be used for other force actuating arrangements.

As the force generating portion of this actuator is of the same design as that of the FIG. 2 actuator, only a short description is made here.

The actuator according to FIG. 5 has a housing 50 with a first lid 51 provided with a fixed ear 52. A movable ear 53 extends out of the housing 50 opposite the fixed ear 52.

A cylindrical permanent magnet 54 is supported by a partition wall 55 in the housing 50, and a cylindrical coil 56 is arranged within the permanent magnet. A rod 57 of Terfenol is arranged within the coil 56.

Coaxially in line with the rod 57 is a drive member 58. A pull bar 59 provided with end flanges at both ends extends through holes in the drive member 58, the rod 57 and the lid 51. A compression spring 60 exerts a pull force in the bar 59 and accordingly provides the necessary prestress in the Terfenol rod 57.

The movement transforming device for the actuator according to FIG. 5 has the following design:

The force transmission between the drive member 58 and the ear 53 is effected by means of a so called toggle joint, consisting of two legs 61 and 62 forming an obtuse angle at their connection point. The first leg 61 is pivotally attached to the drive member 58 and the second one 62 to the ear 53. At the connection point a control rod 63 is pivotally attached.

The rod 63 extends through a block 64, which is pivotally attached to the housing 50 inside a second lid 65. Between the rod 63 and the block 64 there is arranged a one-way clutch in the form of spring-biased balls 66 cooperating with the rod and ramps inside the block so as only to allow movement to the right in FIG. 5 of the rod 63 under the action of a spring 67 situated between the block 64 and a rod flange 63'.

During the reciprocation stroke downwards in FIG. 5 of the Terfenol rod 57 and accordingly the drive member 58 the movement will be directly transferred by the legs 61 and 62, which are locked in their positions by the control rod 63. Force is transmitted to the ear 53 and further on.

During the reciprocation stroke upwards in FIG. 5, i.e. the return stroke of the Terfenol rod 57 and accordingly the drive member 58, the slack created by the fact that the ear 53 does not follow the return stroke is eliminated in that the toggle joint 61, 62 is straightened by the control rod 63, which is free to move to the right in FIG. 5 assisted by the spring 67. The described function is dependent on the basic fact that the reciprocation frequency of the Terfenol rod is higher than the natural frequency of the force transmitting means of which the ear 53 is a part.

In order to accomplish a return stroke there must be provided means, which are not shown, to make the control rod 63 free to move to the left in FIG. 5, for example under the action of a magnet (not shown).

I claim:

1. A force actuating system comprising in combination, an axially reciprocating force generating member, an axially movable force transmitting member, a mechanism for transforming force from the reciprocating member into undirectional movement of the force transmitting member, and means for reciprocating the force generating member at a frequency higher than the natural frequency of the force transmitting member;

wherein the mechanism further comprises a toggle joint including two arms extending from a joint therebetween and coupling the reciprocating member and the force transmitting member to move the force transmitting member, a rod connected to and movable by the toggle joint, and a one-way clutch for restraining movement of the rod in one direction.

* * * * *